United States Patent [19]

Kawazoe

[11] Patent Number: 4,891,828
[45] Date of Patent: Jan. 2, 1990

[54] VOLTAGE TO PULSE-WIDTH CONVERSION CIRCUIT

[75] Inventor: Akio Kawazoe, Tokyo, Japan

[73] Assignee: Oki Electric Industry Co., Ltd., Tokyo, Japan

[21] Appl. No.: 165,716

[22] Filed: Mar. 8, 1988

[30] Foreign Application Priority Data

Mar. 9, 1987 [JP] Japan .................................. 62-53386

[51] Int. Cl.[4] ........................ H03K 21/08; H03K 5/26
[52] U.S. Cl. .................................... 377/114; 377/42; 307/265; 315/291; 315/DIG. 4
[58] Field of Search ....................... 307/265, 266, 267; 328/58; 377/20, 114, 42; 340/767; 315/291, DIG. 4, 293, 294, 297

[56] References Cited

U.S. PATENT DOCUMENTS

| | | | |
|---|---|---|---|
| 3,906,247 | 9/1975 | Heffner | 328/58 |
| 4,028,609 | 6/1977 | Detering | 307/265 |
| 4,241,295 | 12/1980 | Williams | 315/291 |
| 4,287,468 | 9/1981 | Sherman | 315/DIG. 4 |
| 4,330,751 | 5/1982 | Swain | 307/265 |
| 4,365,202 | 12/1982 | Sinniger | 328/58 |
| 4,370,067 | 1/1983 | Iwakura et al. | 368/202 |
| 4,396,869 | 8/1983 | Rosenbaum et al. | 315/291 |
| 4,415,861 | 11/1983 | Palmquist et al. | 307/265 |
| 4,754,163 | 6/1988 | Aue et al. | 307/265 |

Primary Examiner—John S. Heyman
Attorney, Agent, or Firm—Spencer & Frank

[57] ABSTRACT

A voltage to pulse-width conversion circuit includes a counter which counts a reference frequency signal and produces a multi-bit digital value; a digital/analog converter which converts the digital value into an analog signal; and a voltage comparator which compares an output of the digital/analog converter with a control signal and produces a pulse width modulated output signal which has a predetermined duty cycle ratio.

11 Claims, 9 Drawing Sheets

VOLTAGE TO PULSE-WIDTH CONVERSION CIRCUIT

BACKGROUND OF THE INVENTION

This invention relates to a voltage to pulse-width conversion circuit for adjusting the brightness of an electronic indicating device such as a fluorescent character display tube or the like.

Some automobiles are provided with an electronic indicating panel on a dashboard which is controlled by a driving circuit and which may be used, for example, for an audio system, etc.

It is desirable to dim suitably the brightness of the electronic indicating panel during a night drive, because the glare of the element fatigues a driver.

For this reason, a voltage to pulse-width conversion circuit has been used to control the pulse-width of a drive signal from the driving circuit to the segment electrode of an indicating panel for adjusting the brightness of the indicating panel.

The known voltage to pulse-width conversion circuits can be roughly divided into analog type and digital type systems. Their structures will now be described with reference to the accompanying drawings.

FIG. 2 shows one of conventional analog type voltage to pulse-width conversion circuits which comprises a voltage comparator 20 having a positive input for receiving a pulse width control signal S1 through an input terminal 1 and an output 2 for producing a pulse width modulation signal (hereinafter referred to as a PWM signal) S2, and a CR oscillation circuit 10. A CR oscillation circuit 10 has an output terminal connected to the negative input of voltage comparator 20. An output of the voltage comparator 20 is connected to the output terminal 2.

The CR oscillation circuit 10 produces sawtooth waveform signals S10. This circuit consists of a voltage comparator 11 having an NPN transistor in a collector open state, a capacitor 12, and five resistors 13-17. The voltage comparators 11 and 20 operate on the positive voltage V10 of a current source used for an electronic indicator device (not shown in the figure). A signal S11a divided by the resistors 13 and 14 is applied to the positive input of the voltage comparator 11. The voltage comparator 11 has a negative input for receiving a signal S11b which is supplied through resistor 17.

The input terminal 1 is connected to an input circuit which supplies a PWM input signal S1. This input circuit has a switch 30 for illumination of the interior of an automobile during a night drive. The switch 30 has one terminal connected to a positive voltage V30 of a 13.8 V battery and the other terminal connected to a variable resistor 31 which is normally adjusted by a driver. The variable resistor 31 supplies a divided voltage across the resistors 32 and 33, an intermediate node between the registers 32 and 33 is connected to the input terminal 1.

FIG. 3 shows signal waveforms generated in the circuit of FIG. 2. FIG. 4 is a chart which illustrates input-output characteristics of the circuit of FIG. 2. Operation of the circuit of FIG. 2 will now be described with reference to FIGS. 3 and 4.

When the voltage V10 is applied to the CR oscillation circuit 10 and the voltage comparator 20 of FIG. 2, the CR oscillation circuit 10 begins to oscillate and normally generates on its output an oscillation signal S10 having a frequency of about 128 Hz. This signal S10 is fed to the negative of voltage comparator 20. The frequency and waveform of oscillation signal S10 are determined by the time constant of the capacitor 12 and the resistors 13-17. More specifically, when capacitor 12 is charged through the resistors, the potential of an input signal S11b on the negative input of comparator 11 is increased. At this moment, the potential of input signal S11a entering the positive-input of voltage comparator 11 also is slightly increased under the effect of a feed back resistor 15 based on a reference potential divided by resistors 13 and 14. A feed back resistor 17 has a much lower value of resistance than those of the other resistors 13-16. When the potential of an input signal S11b on the negative input of the voltage comparator 11 becomes higher than that of the input signal S11a, the output signal S10 of the voltage comparator 11 is set to a low level (hereinafter designated merely by the letter "L"). Therefore, the charge voltage on capacitor 12 is quickly discharged to the ground (=0V) through resistor 17. At the same time, the input signal S11a also quickly decreases its potential. The amount of such a change in the potential is determined by values of the resistors 13 to 17. When the potential of the input signal S11b falls below that of the input signal S11a, the voltage comparator 11 is set OFF, and until the potential of the input signal S11b becomes higher than that of the input signal S11a, the capacitor 12 will be charged through the resistors. Such an action will sustain operation of the CR oscillation circuit 10.

For example, when the illumination switch 30 is in the ON position during a night drive, the battery voltage V30 is supplied across the variable resistor 31. A voltage divided by the variable resistor 31 is subdivided by the voltage dividing resistors 32 and 33. The voltage at the point between resistors 32 and 33 is fed to the input terminal 1 in the form of a PWM input signal S1 supplied to the positive input of the voltage comparator 20. When the variable resistor 31 is manually adjusted, the level of the PWM input signal S1 varies as shown in FIG. 3 as S1-1 and S1-2. The voltage comparator 20 compares the level of the output signal S10 with that of the PWM input signal S1, performs a voltage to pulse-width conversion, and supplies a PWM output signal S2 to the output terminal 2. The PWM output signal S2 first falls into a high level (hereinafter designated merely by the letter "H") at a range of S10 < S1 and then becomes "L" at a range of S10 > S1.

The input-output characteristics of PWM output signal S2 versus PWM input signal S1 as shown in FIG. 4 are determined by the output waveform of the CR oscillation circuit 10. However, there is a limit to the obtainable accuracy (closeness to the ideal characteristic) in the above described method (of selecting the resistors 13 to 17 and capacitor 12).

FIG. 5 illustrates an example of a conventional digital type voltage to pulse-width conversion circuit.

This voltage to pulse-width conversion circuit has an analog/digital converter (hereinafter referred to as an A/D converter). The circuit has an input terminal 40 for receiving a PWM input signal S1, an input terminal 41 for receiving a reference frequency signal S0, and an output terminal 42 for generating a PWM output signal S2. Installed in series between the input terminal 40 and the output terminal 42 are a ten-bit A/D converter 43, a (1024 word x ten-bit) read-only memory (hereinafter referred to as ROM) 44, and a ten-bit PWM generation circuit 45. The input terminal 41 is also connected to an input of a timing generation circuit 46. An output of the circuit 46 is connected to the A/D converter 43, the ROM 44, and the PWM generation circuit 45.

Operation of this system will now be described.

When a reference frequency signal S0 is supplied to the input terminal 40, the timing generation circuit 46 generates a timing signal to be supplied to the A/D converter 43, the ROM 44, and the PWM generation circuit 45. The A/D converter 43 converts the PWM input signal S1 into a digital signal to be transmitted to the ROM 44. The ROM 44 reads out the data corresponding to the digital signal, and the PWM generation circuit 45 generates a PWM output signal S2 corresponding to the received data to the output terminal 42.

Nevertheless, the circuits described above have the following disadvantages:

(I) In the conventional analog type voltage to pulse-width conversion circuit, because the CR oscillation circuit 10 must generate a low frequency signal of 128 Hz, each of the resistors 13-17 requires a very high resistance value i.e., of about several hundred kOhm. Therefore, it is very difficult to integrate the CR oscillation circuit 10 in a semiconductor IC chip. The variations in resistance values of the resistors 13-17 due to process conditions affect the output oscillation waveform and decrease the frequency stability of the PWM output signal S2. The use of external resistors 13-17 increases the number of IC lead terminals. It will not be practical to make a voltage to pulse-width conversion circuit by using discrete components, because there is generally not enough mounting space on the back side of the indicating panel of a car radio (tuner).

As the characteristics of the PWM input signal S1 and the PWM output signal S2 are determined by the oscillation signal S10, it is not possible to vary arbitrarily the waveform of PWM output signal S2. The capacitance deviation of capacitor 12 which determines the waveform of oscillation signal S10 affects the accuracy of oscillation signal S10.

(II) The digital type voltage to pulse-width conversion circuit shown in FIG. 5 is large in circuit scale. This leads to an increase in chip size as well as in cost. In a real construction, it is difficult to integrate the conversion circuit with a drive circuit and other circuits into one chip.

SUMMARY OF THE INVENTION

An object of this invention is to provide a voltage to pulse-width conversion circuit which solves the problems associated with the prior art technique and makes it possible to minimize the actual dimensions of the IC chip.

In accordance with this invention, the voltage to pulse-width conversion circuit which converts a PWM input signal into a PWM output signal having a predetermined duty ratio comprises a counter which counts a reference frequency signal to produces a multi-bit digital value, a digital/analog converter (hereinafter referred to as D/A converter) which converts the digital value into an analog signal, and a voltage comparator which compares an analog output signal of the D/A converter with a control signal for pulse width modulation and produces a modulated output signal which has a predetermined duty ratio.

In the structure described above, a counter counts a reference frequency signal and sends the counted number signal to a D/A converter. The D/A converter converts the digital value obtained into an analog signal which, in turn, is transmitted to a comparator. The comparator compares the analog signal with the PWM input signal in levels and outputs the PWM output signal having a duty ratio. Such a design makes it possible to increase the accuracy of the PWM output signal and diminish the chip size.

DETAILED DESCRIPTION OF THE PREFERRED EMBODIMENTS

A preferred embodiment of the voltage to pulse-width conversion circuit of this invention will be described with reference to FIG. 1 and FIGS. 6 to 8.

Figure 1:
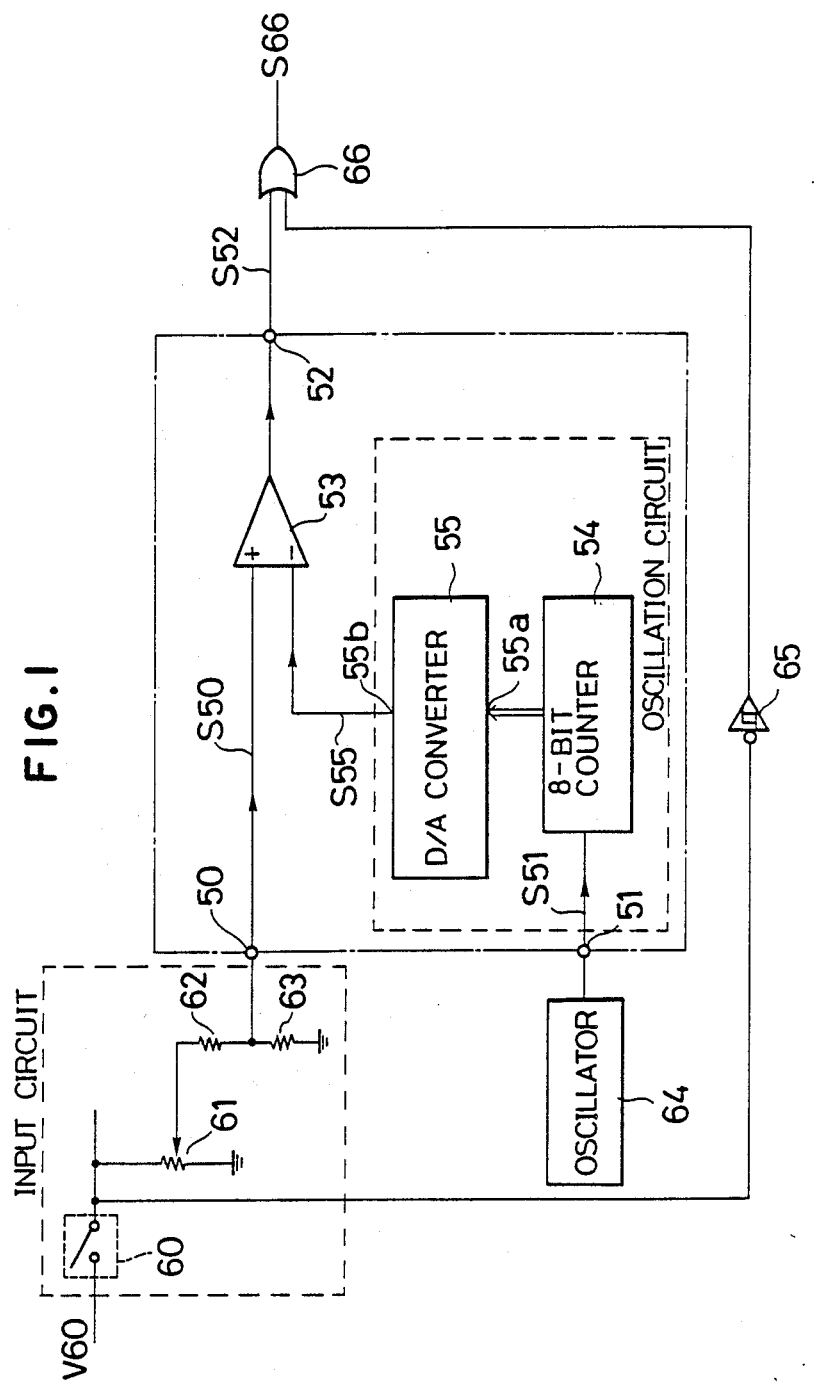
FIG. 1 is a circuit diagram of a voltage to pulse width conversion circuit according to the first embodiment of this invention.

A voltage to pulse-width conversion circuit in accordance with the first embodiment of this invention is shown in FIG. 1.

Figure 2:
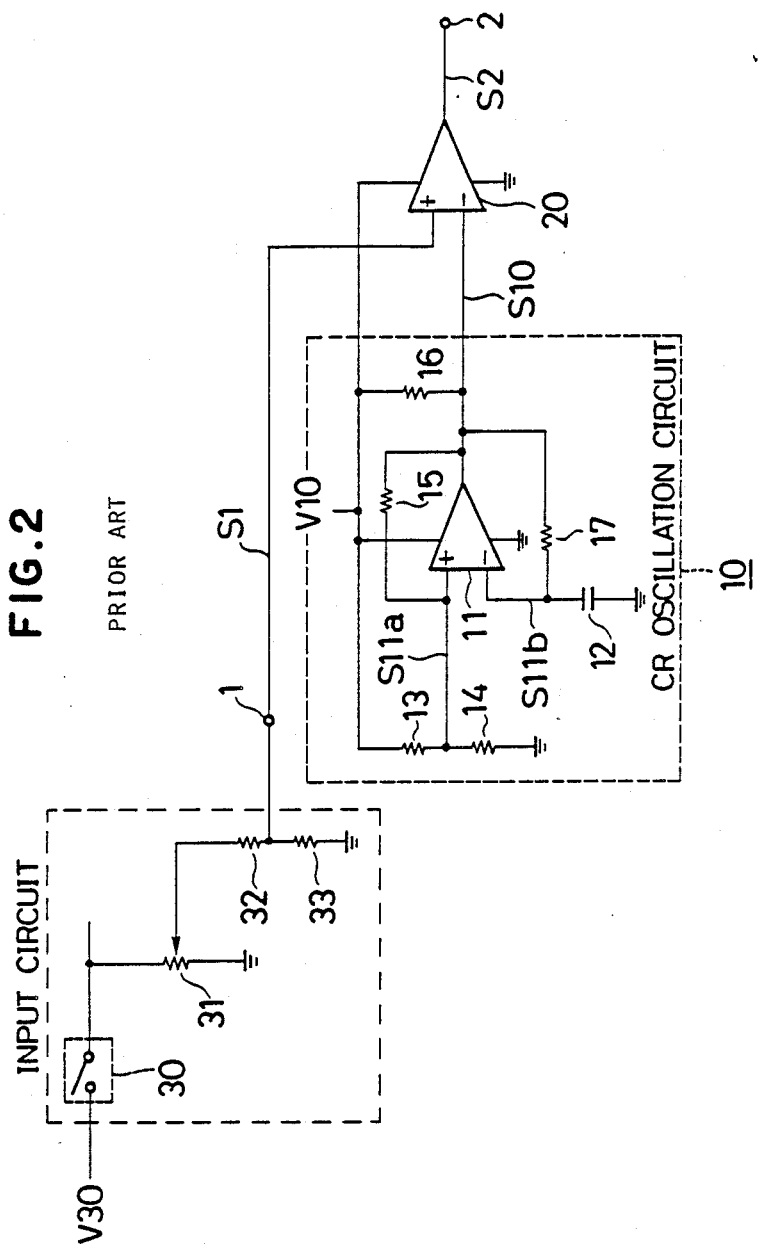
FIG. 2 is a circuit diagram of a conventional analog type voltage to pulse-width conversion circuit.
Figure 3:
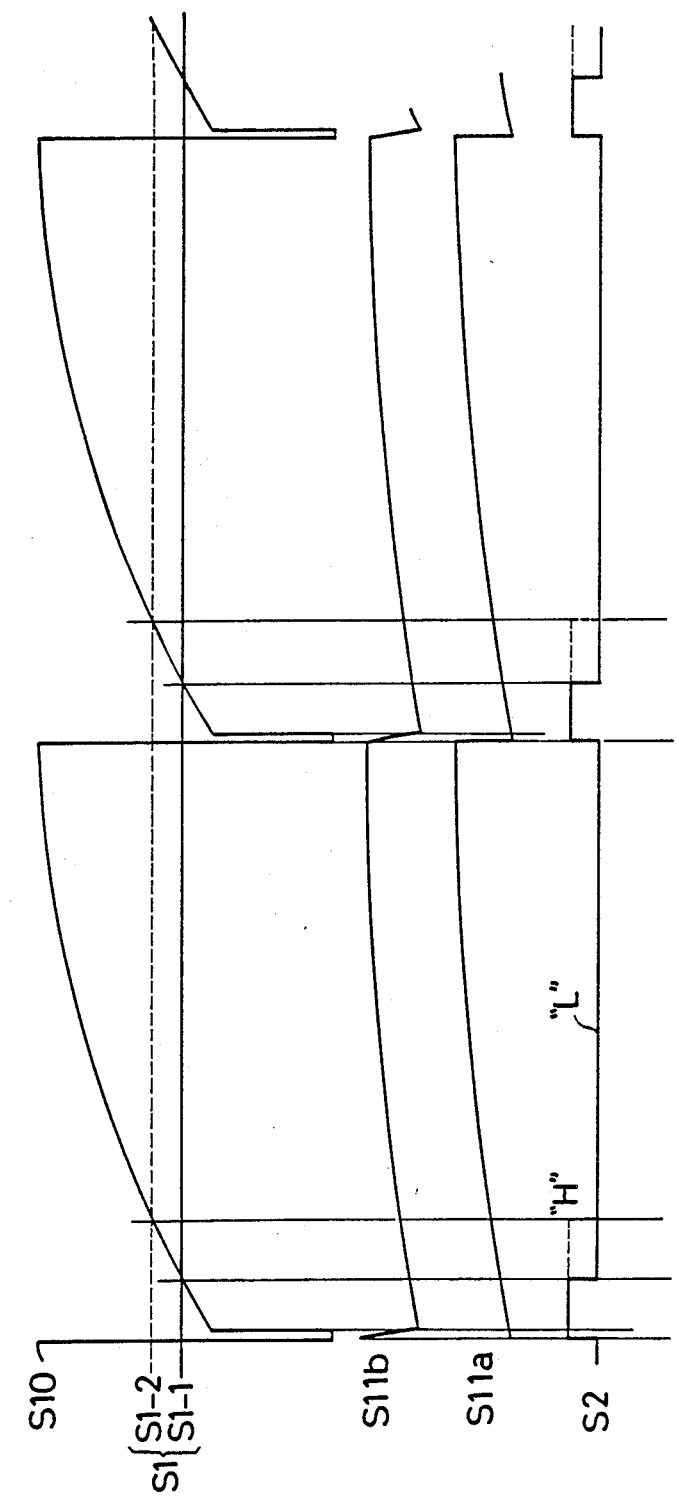
FIG. 3 shows waveforms of signals generated by the circuit of FIG. 2.
Figure 4:
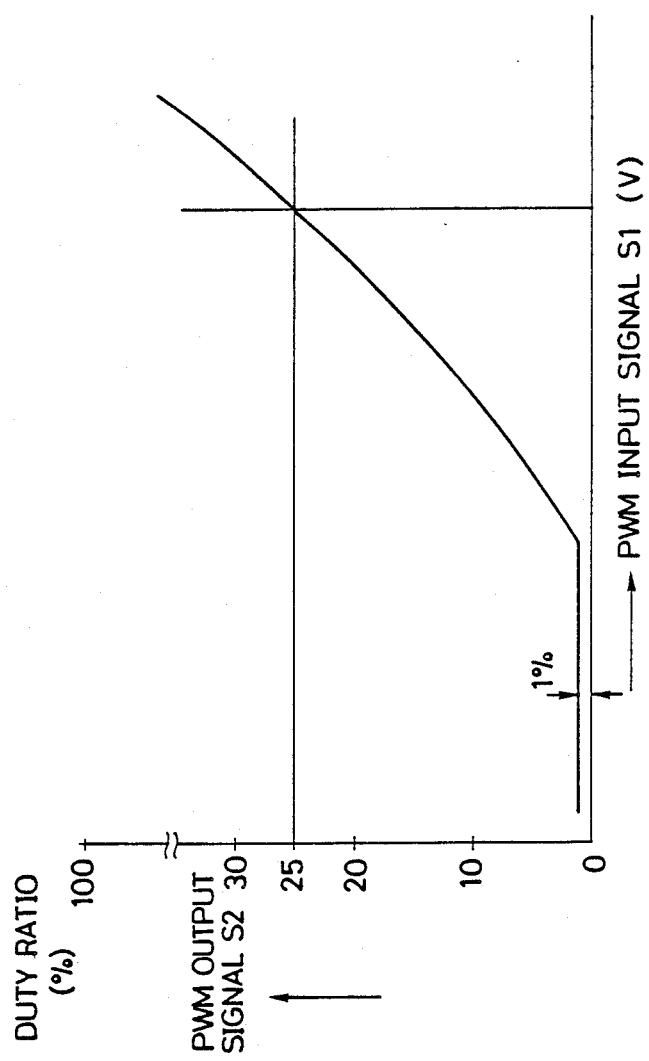
FIG. 4 shows input-output characteristics of the circuit of FIG. 2.
Figure 5:
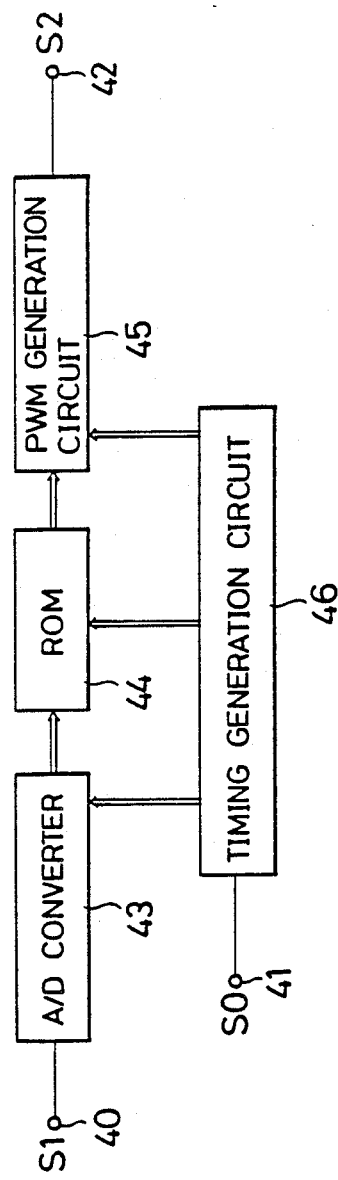
FIG. 5 is a conventional digital type voltage to pulse-width conversion circuit.

The voltage to pulse-width conversion circuit shown in this figure comprises an oscillation circuit which incorporates a multi-bit counter 54 and a multi-bit D/A converter 55. This oscillation circuit corresponds to the CR oscillation circuit 10 of the conventional circuit shown in FIG. 2.

More specifically, the voltage to pulse-width conversion circuit of this invention has an input terminal 50 for receiving a PWM input signal S50, an input terminal 51 for receiving a reference frequency signal S51, and an output terminal 52 which issues a PWM output signal S52, e.g., of 128 Hz. The input terminal 50 is connected to a positive input of a voltage comparator 53, whereas an output of comparator 53 is connected to output terminal 52. Input terminal 51 is also connected to a counter 54, e.g., an eight-bit binary counter. An output terminal of counter 54 is connected to an input terminal 55a of, e.g., a six-bit D/A converter 55. The D/A converter 55 converts the output signal of the counter 54, which is fed to input terminal 55a, into an analog signal. This analog signal S55 is generated on an output terminal 55b, which is connected to a negative input of voltage comparator 53.

The input terminal 50 is connected to an input circuit for suppling PWM input signal S50. The input circuit has a switch 60 which illuminates various meters on a dashboard in an automobile during a night drive. One terminal of switch 60 receives a positive battery voltage V60 (which is normally 13.8 V), while the other terminal thereof is grounded through a variable resistor 61 which is manually adjusted. An output terminal of the variable resistor 61 is grounded through the voltage-dividing resistors 62 and 63. The point of interconnection between the voltage-dividing resistors 62 and 63 is connected to the input terminal 50.

The input terminal 51 is connected to an oscillator 64 which supplies a reference frequency signal S51, e.g., of 32.768 KHz. The other terminal of switch 60 is also connected to an input of a detection circuit 65 which detects an OFF condition of the switch 60 and produces a high level signal, or 'H' level signal. An output terminal of the detection circuit 65 is connected to an input terminal of a logical OR gate 66 which has two inputs and an output for providing a PWM output signal S66 to a driving circuit.

Figure 6:
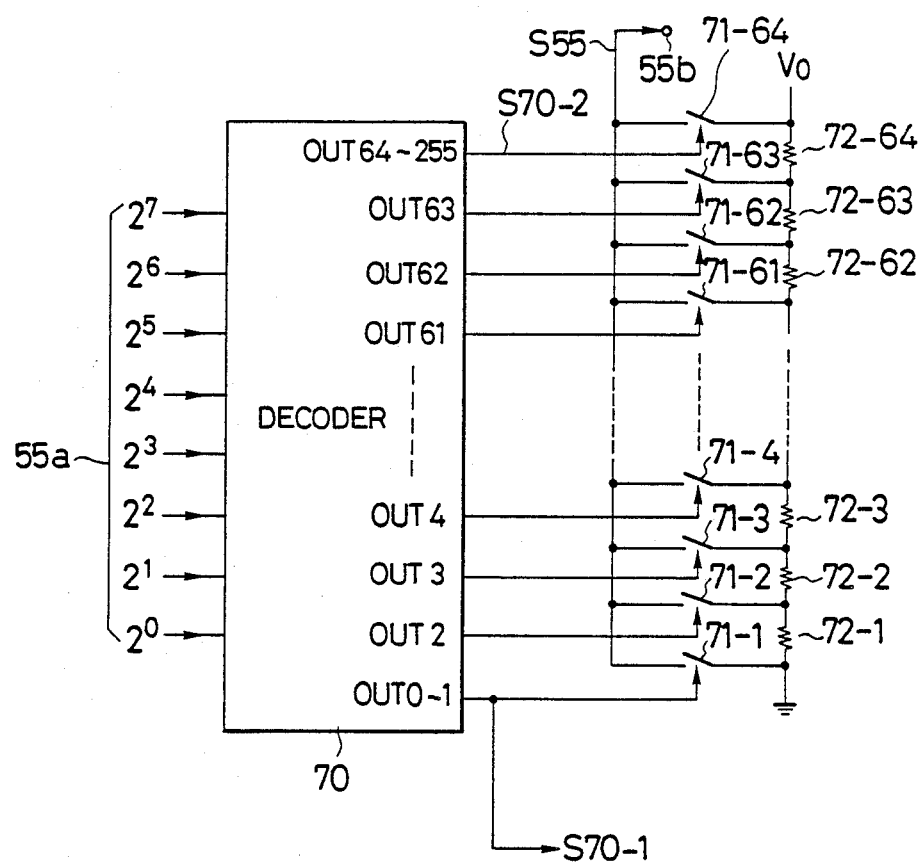
FIG. 6 is a circuit diagram of D/A converter used in the circuit of FIG. 1.

FIG. 6 is a circuit diagram of the six-bit D/A converter 55 of FIG. 1.

The D/A converter 55 comprises a resistance, voltage-dividing type converter which has a decoder 70, analog switches 71-1 to 71-64, and voltage-dividing resistors 72-1 to 72-64. The decoder 70 includes an input terminal 55a for receiving eight-bit signals $2^0$ to $2^7$, and OUT 0-1, OUT2 to OUT63, and OUT64-255 output terminals. The decoder 70 decodes the input signals and produces decoded signals on its output. Each output terminal (i.e., OUT0-1, OUT2 to OUT63, OUT64-255) of decoder 70 is connected to a respective control input terminal of an analog switch 71-1 to 71-64. One side of each analog switch 71-1 to 71-64 is connected to an output terminal 55b, while the other side of each analog switch 71-1 to 71-64 is connected to a point between respective voltage-dividing resistors 72-1 to 72-64. The one side of analog switch 71-1 and one side of the voltage-dividing resistor 72-1 are grounded, and the other sides of the analog switch 71-64 and the voltage-dividing resistor 72-64 are connected to a reference voltage $V_o$. The output terminal OUT0-1 of the decoder 70 issues a signal S70-1, and the output terminal OUT64-255 issues the signal S70-2.

Figure 7:
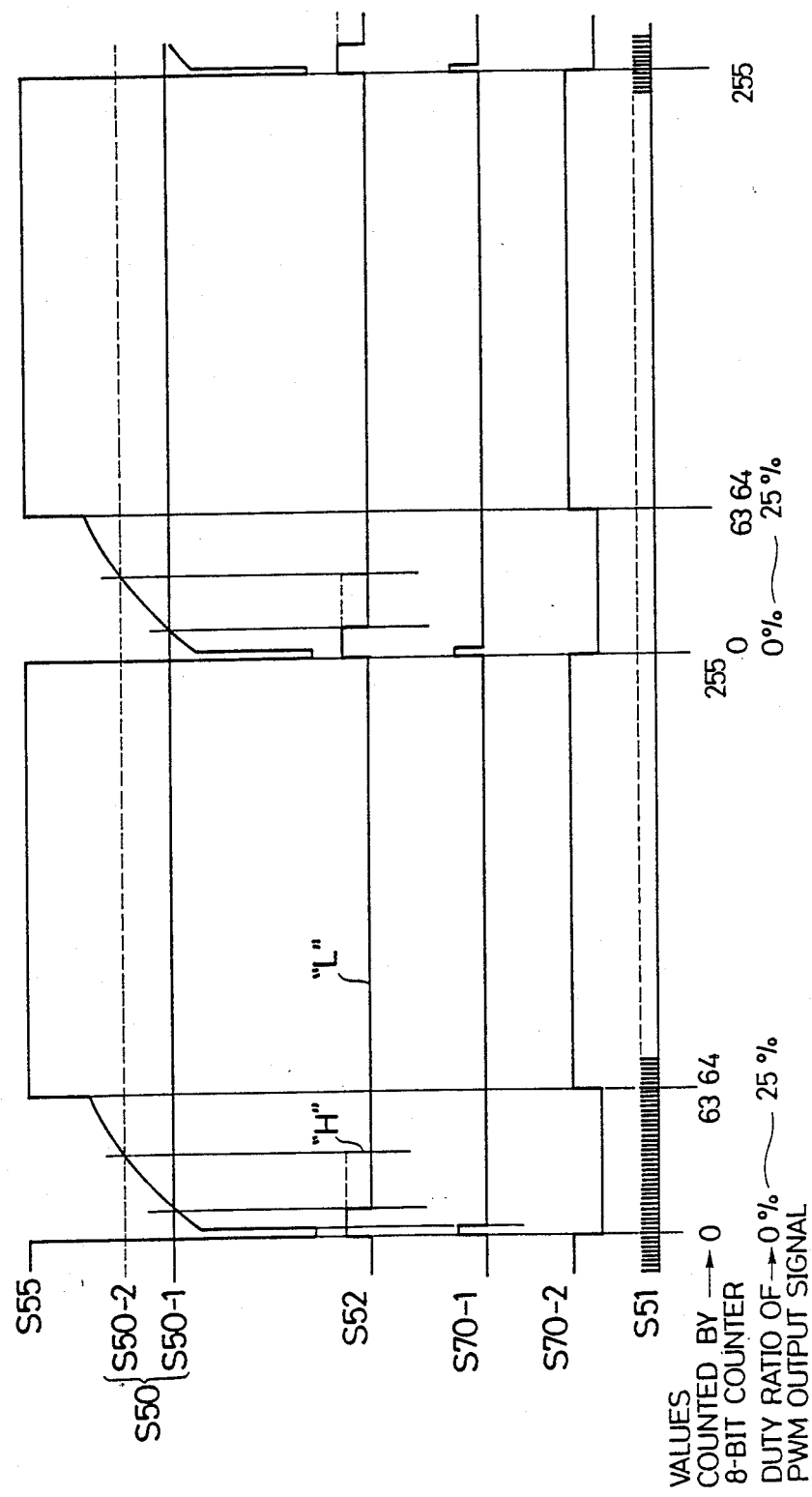
FIG. 7 shows waveforms of signals generated by the circuit of FIGS. 1 and 6.
Figure 8:
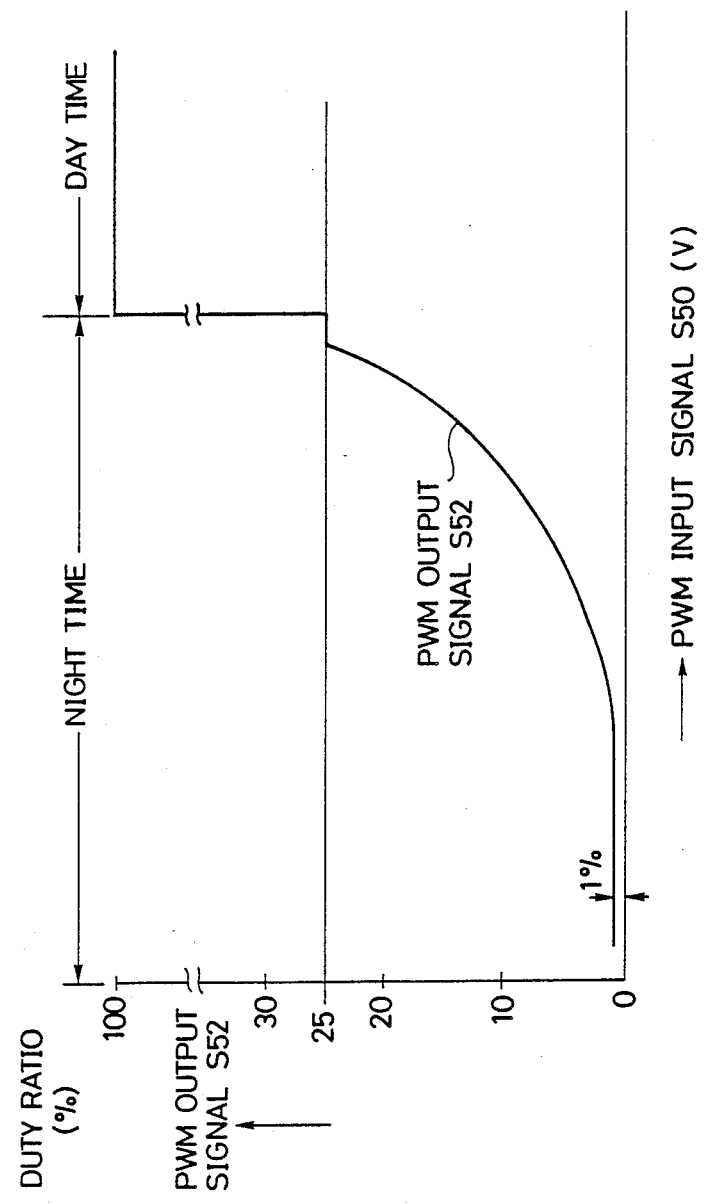
FIG. 8 shows input-output characteristics of the circuit of FIG. 1.

FIG. 7 shows signal waveforms seen in the circuits in FIGS. 1 and 6. FIG. 8 illustrates input-output characteristics of the circuit of FIG. 1. The operation of circuits of FIGS. 1 and 6 will now be explained with reference to FIGS. 7 and 8.

First of all, when the ignition key of an automobile is ON and the power source for an electronic indicating device also is ON, the circuit of FIG. 1 will be energized, the oscillator 64 begins to oscillate and produces on its output a reference signal S51 of 32.768 kHz. This signal S51 is supplied through the input terminal 51 to the eight-bit counter 54 which continuously counts from 0 to 255. The counter 54 feeds the output to the input terminal 55a of the six-bit D/A converter 55.

The decoder 70 successively selects one of the output terminals OUT0-1, OUT2 to OUT63, OUT64-255, in accordance with a counted value to switch successively ON a selected one of the analog switches 71-1 to 71-64 via selected output terminals OUT0-1, OUT2 to OUT63, OUT64-255, and then to output a voltage signal S55 divided by resistors 72-1 to 72-64 to the output terminal 55b.

In other words, when the counter 54 counts a value of 0 or 1, the decoder 70 set only the analog switch 71-1 to an ON state to provide 0V signal S55 to the output terminal 55b.

On the other hand, when the counter 54 counts a value of 2, the decoder 70 sets only the analog switch 71-2 to an ON state to a fraction voltage between the resistors 72-1 and 72-2 as a signal S22 to the output terminal 55b.

In the same manner, in accordance with the counting operation of the counter 54, the decoder 70 selects the analog switches 71-1 to 71-64 to supply the signal S55 having waveforms as seen in FIG. 7 to the negative input of the voltage comparator 53. In FIG. 7, the linear curve between counted values 2 and 63 is represented in a staircase form in detail.

When the indicator illumination switch 60 is ON for driving an automobile at night, a 13.8 V battery voltage v60 is supplied across the variable resistor 61 which can produce a divided voltage signal between 0 and 13.8 V. The divided voltage is applied to the resistance voltage-divider. The resistance values of the resistors 62 and 63 are determined on the swing range of an output signal S55 of the D/A converter 55, as well as on the swing range of an input signal of the voltage comparator 53. The divided voltage of the resistance voltage-divider is fed to the positive input terminal of the voltage comparator 53 as a PWM input signal S50 through input terminal 50. The level of the PWM input signal S50 can be varied by means of variable resistor 61, as shown in FIG. 7 as signals S50-1 and S50-2.

The voltage comparator 53 compares the output signal S55 of D/A converter 55 with the PWM input signal S50 to output a PWM output signal S52 to the terminal 52. The PWM output signal S52 becomes "H" within the range of $S50 \geq S55$, and "L" within the range of $S50 \leq S55$. Therefore, as shown in FIG. 7, the PWM output signal S52 having a duty ratio corresponding to the voltage of PWM input signals S50 can be obtained by adjusting the variable resistor 61.

As shown in FIG. 8, the PWM control range for night driving corresponds to the duty ratio of PWM output signal S52 between 1 and 25%. The characteristic curve of PWM output signal S52 in the 1%–25% zone is not linear and fine adjustments can be performed in the vicinity of 1% duty ratio while coarse adjustments can be performed near the 25% duty ratio. A driver can freely adjust the PWM control ranges. The waveform of output signal S55 of the converter 55 determines such PWM characteristics. The desired waveform of output signal S55 can be obtained by changing a resistance ratio between the resistors 72-1 to 72-64. The PWM control which has fine adjustment characteristics near 1% duty ratio and coarse adjustment characteristics near 25% duty ratio can be obtained by upwardly and gradually reducing the resistors 72-2 to 72-63 in resistance value.

The use of the D/A converter 55 shown in FIG. 6 has the following advantages. If the reference voltage $V_o$ is stable, the level stability of the output signal S55 is determined by a resistance ratio among the voltage-dividing resistors 72-1 to 72-64. Therefore, integrated voltage dividing resistors are sufficiently practical, if resistance deviation of e.g., below 2%, is guaranteed by controlling IC manufacturing tolerances. This means that the output signal S55 is required to have linear characteristics only over a setting range.

When a car is driven in daytime, the brightness of the electronic indicator is insufficient, as the inside of the car is bright. Therefore, under this condition it is desirable to drive the circuit with a 100% duty ratio as shown in FIG. 8. Setting of the circuit for day or nighttime driving is performed by switching the switch 60 ON or OFF. For example, when the switch 60 is ON, night time mode is detected and when the switch 60 is OFF, and the day-time mode is detected. When the switch 60 is ON, the detection circuit 65 outputs an "H"

level signal whereby the OR gate 66 provides the PWM output signal S66 of a 100% duty ratio in day-time mode.

Figure 9:
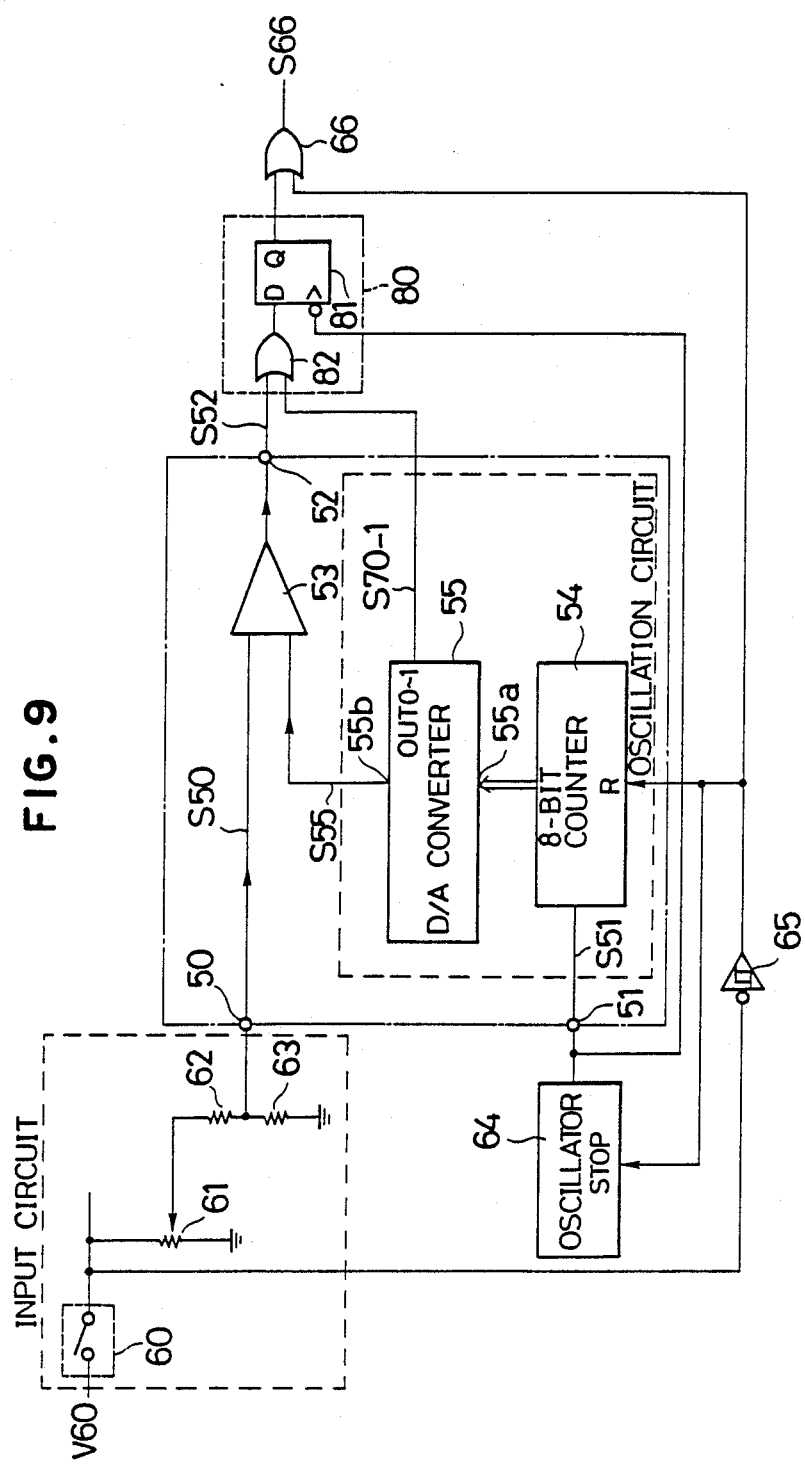
FIG. 9 is a circuit diagram of a voltage to pulse-width conversion circuit in accordance with the second embodiment of this invention.

FIG. 9 shows a circuit diagram of a voltage to pulse-width conversion circuit in accordance with the second embodiment of the present invention. The elements identical with those shown in FIG. 1 are designated by the same reference numerals.

In the second embodiment, the voltage to pulse-width conversion circuit has an additional circuit 80 connected between one input terminal of the OR gate 66 and the output terminal 52, and oscillator 64 having a terminal for receiving a control signal from the detection circuit 65 to stop the oscillation. In addition, an eight-bit counter 54 is provided with a reset terminal R for receiving a control signal from the detection circuit 65 to perform a reset function.

In this embodiment, the additional circuit 80 consists of a D-type flip-flop (hereinafter referred to as D-FF) 81 and a two-input OR gate 82. The OR gate 82 can positively maintain the 1% duty ratio of the PWM characteristic as shown FIG. 8, even though PWM input signal approaches zero. One input terminal of this OR gate 82 is connected to the output terminal 52, while the other input terminal of the OR gate 82 is connected to the output terminal OUT0-1 of decoder 70 in D/A converter 55. The D-FF circuit prevents unfavorable effects to the PWM output signal due to a transient spike or overshoot (glitch) which occurs in the ON-/OFF operation of the analog switches 71-1 to 71-64. In the D-FF 81, its data input terminal D is connected to an output terminal of OR gate 82, its clock terminal is connected to an output terminal of oscillator 64, while its output terminal Q is connected to an input terminal of OR gate 66.

When the output signal of detection circuit 65 becomes an "H" level, the oscillator 64 stops oscillating, and at the same time the eight-bit counter 54 is reset. When the decoder 70 in the converter 55 selects the output terminal OUT-1, a pulse signal S70-1, as shown in FIG. 7, is issued to the data input terminal D of D-FF81 through the OR gate 82. As a result, a PWM output signal S52 having a 1% duty ratio is obtained at its low level, as shown in FIG. 8, and the unfavorable effect of glitch as will be prevented.

It should be understood that the present invention is not limited only to those embodiments shown in the drawings, and can be variously modified. These modifications may be, for example, as follows:

(a) The counter 54 may be a different bit counter and may be a counter having a different coding system. In that case, the decoder 70 of D/A converter 55 should be naturally matched with the corresponding counting code.

(b) The six-bit resistor-type voltage-dividing D/A converter 55 may be replaced by other types and other bit-number D/A converters.

(c) Various modifications are also possible in the input circuit connected to the input terminal 50. The device of this invention can be applied in systems other than electronic display devices.

As has been described in detail above, since the voltage to pulse-width conversion circuit of this invention comprises a counter, a D/A converter, and a voltage comparator, it is small in size and it has a reduced number of terminals as well a reduced number of externally components. This makes easily possible a single chip integration with a drive circuit for a display device as well as cost reduction of the device. The conversion circuit can be easily mounted into the limited space for an electronic display device of an automobile, etc.

In addition to the above, the characteristics of a PWM output signal versus a PWM input signal can be arbitrarily selected at the design stage. As a result, the brightness control can be conducted with high accuracy. An input offset voltage below 5 mV does not affect the accuracy of the comparator. Since the accuracy of the resistor-type voltage-dividing D/A converter depends on the resistance ratio of several voltage-dividing resistors, the conversion accuracy due to temperature variations is improved over that of a conventional analog type converter.

The conversion circuit of this invention may find wide practical applications in brightness control circuits for car audio devices (such as tuners, cassette decks, compact discs, car clocks, or similar information indicator devices), or for other electronic indicator devices.

What is claimed is:

1. A brightness control circuit for an electronic indicator, comprising:
    an oscillation circuit which generates a reference frequency signal;
    a counter receiving said reference frequency signal and producing a digital output signal having a multi-bit digital value corresponding to a count of cycles of said reference frequency signal;
    a digital/analog converter receiving said digital output signal and producing an analog output signal having an analog value which corresponds to said multi-bit digital value, said digital/analog converter comprising a decoder for producing a decoded signal from an eight-bit input signal, a plurality of analog switches which are individually selectable according to said decoded signal, and a plurality of voltage-dividing resistors connected to a voltage supply, said voltage-dividing resistors being correspondingly connected to ones of said plurality of analog switches;
    means for supplying a selected reference voltage; and
    a voltage comparator receiving as inputs and comparing said reference voltage and said analog output signal, and producing a pulse width modulation signal corresponding to the difference between said inputs, said pulse width modulation signal determining a duty cycle ratio for controlling the brightness of the electronic indicator; whereby said voltage supply is divided by said voltage-dividing resistors to produce said output voltage signal corresponding to said analog value via the selected one of said plurality of analog switches.

2. A brightness control circuit for an electronic indicator as set forth in claim 1, wherein said pulse width modulation signal has a relatively high level when the value of said reference voltage is higher than said analog value, and a relatively low level when the value of said reference voltage is lower than said analog value.

3. A brightness control circuit for an electronic indicator as set forth in claim 1, wherein said pulse width modulated signal has a characteristic curve which is non-linear in a duty cycle ratio range of from 1% to 25%, which has a relatively small slope in the vicinity of a region corresponding to a 1% duty cycle ration, and which has a relatively steep slope in the vicinity of a region corresponding to a 25% duty cycle ratio.

4. A brightness control circuit as set forth in claim 1, wherein said counter counts said reference frequency signal continuously.

5. A brightness control circuit as set forth in claim 1, wherein, when said count of said counter reaches its maximum value, the value of said count is returned to an initial value, and said counter starts counting again from said initial value.

6. A brightness control circuit as claimed in claim 1, wherein said means for supplying a selected reference voltage is adjustable.

7. A brightness control circuit for an electronic indicator, comprising:
   an oscillation circuit which generates a reference frequency signal;
   a counter receiving said reference frequency signal and producing a digital output signal having a multi-bit digital value corresponding to a count of cycles of said reference frequency signal;
   a digital/analog converter receiving said digital output signal and producing an analog output signal having an analog value which corresponds to said multi-bit digital value;
   means for supplying a selected reference voltage; and
   a voltage comparator receiving as inputs and comparing said reference voltage and said analog output signal, and producing a pulse width modulation signal corresponding to the difference between said inputs;
   a detection circuit which detects an OFF condition of said means for supplying a selected reference voltage and produces an output detection signal having a relatively high value in response to said OFF condition, and
   a logical OR gate receiving as inputs said pulse width modulation signal and said detection signal and producing a logical output signal which is a logical sum of said inputs, said logical output signal being supplied to said electronic indicator for determining a duty cycle ratio for controlling brightness of said electronic indicator.

8. A brightness control circuit for an electronic indicator, comprising:
   an oscillation circuit which generates a reference frequency signal;
   a counter receiving said reference frequency signal and producing a digital output signal having a multi-bit digital value corresponding to a count of cycles of said reference frequency signal;
   a digital/analog converter receiving said digital output signal and producing an analog output signal having an analog value which corresponds to said multi-bit digital value;
   means for supplying a selected reference voltage; and
   a voltage comparator receiving as inputs and comparing said reference voltage and said analog output signal, and producing a pulse width modulation signal corresponding to the difference between said inputs, said pulse width modulation signal determining a duty cycle ratio for controlling the brightness of the electronic indicator; and
   a logical OR gate receiving as inputs said pulse width modulation signal and said analog output signal and producing a logical output signal which is a logical sum of said inputs, said logical output signal being supplied to said electronic indicator.

9. A brightness control circuit for an electronic indicator, comprising:
   an oscillation circuit which generates a reference frequency signal;
   a counter receiving said reference frequency signal and producing a digital output signal having a multi-bit digital value corresponding to a count of cycles of said reference frequency signal;
   a digital/analog converter receiving said digital output signal and producing an analog output signal having an analog value which corresponds to said multi-bit digital value;
   means for supplying a selected reference voltage; and
   a voltage comparator receiving as inputs and comparing said reference voltage and said analog output signal, and producing a pulse width modulation signal corresponding to the difference between said inputs, said pulse width modulation signal determining a duty cycle ratio for controlling the brightness of the electronic indicator; and
   an additional circuit which includes a flip-flop circuit and a logical OR gate, said logical OR gate receiving as inputs said pulse width modulation signal and said analog output signal and producing a logical output signal which is a logical sum of said pulse width modulation signal and said analog output signal, said flip-flop circuit receiving as inputs said logical output signal and said reference frequency signal and producing an output signal which corresponds to said pulse width modulation signal to said electronic indicator, said additional circuit providing stability against transient effects and noise in said output signal which corresponds to said pulse width modulation signal.

10. A brightness control circuit for an electric indicator as set forth in claim 9, further comprising a detection circuit for detecting an OFF condition of said means for supplying a selected reference voltage and producing in response an output detection signal having a relatively high signal level, and a second logical OR gate receiving as inputs said pulse width modulation signal and said output detection signal and producing an output signal which is a logical sum of said pulse width modulation signal and said output detection signal, said output signal produced by said second logical OR gate being supplied to said electronic indicator to control brightness of said electronic indicator.

11. A brightness control circuit for an electric indicator as set forth in claim 10, wherein said oscillation circuit and said counter each receive said output detection signal, and wherein said oscillation circuit stops and said counter resets in response to said output detection signal when said means for supplying a selected reference voltage is in an OFF condition.

* * * * *